United States Patent
Xuechun et al.

(10) Patent No.: US 6,274,500 B1
(45) Date of Patent: Aug. 14, 2001

(54) SINGLE WAFER IN-SITU DRY CLEAN AND SEASONING FOR PLASMA ETCHING PROCESS

(75) Inventors: Dai Xuechun; Liang Chen; Aik Kwang Ng; Young Tsai, all of Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/414,924

(22) Filed: Oct. 12, 1999

(51) Int. Cl.$^7$ .................................................. H01L 21/311
(52) U.S. Cl. .......................... 438/706; 438/714; 438/905; 134/1.1
(58) Field of Search ...................... 438/706, 714, 438/905; 134/1, 1.1, 22, 22.1, 26, 30, 31, 35, 36; 156/345; 118/715

(56) References Cited

U.S. PATENT DOCUMENTS

| | | |
|---|---|---|
| 5,589,233 | 12/1996 | Law et al. .............................. 427/579 |
| 5,647,953 | 7/1997 | Williams et al. .................. 156/643.1 |
| 5,756,400 | 5/1998 | Ye et al. ............................... 438/710 |
| 5,811,356 | 9/1998 | Murugesh et al. .................... 438/711 |
| 5,843,239 | * 12/1998 | Shrotriya ................................ 134/1.1 |
| 5,843,838 | 12/1998 | Chen et al. ........................... 438/632 |
| 5,868,853 | 2/1999 | Chen et al. ............................ 134/1.1 |
| 5,900,161 | 5/1999 | Doi .......................................... 216/60 |
| 5,939,831 | * 8/1999 | Fong et al. ............................ 438/714 |
| 6,090,718 | * 7/2000 | Soga et al. ............................ 438/714 |
| 6,125,859 | * 10/2000 | Kao et al. ............................. 438/905 |

* cited by examiner

Primary Examiner—Benjamin L. Utech
Assistant Examiner—Duy-Vu Deo
(74) Attorney, Agent, or Firm—George O. Saile; Rosemary L. S. Pike

(57) ABSTRACT

A new method is provided for the cleaning and seasoning of a Plasma Etch chamber. The wafer that is to be processed by the chamber is inserted into the chamber. The process of plasma clean is first performed on the Plasma Etch Chamber followed by a seasoning process of the Plasma Etch Chamber. The wafer is processed (etched) and removed from the chamber after the etch process has been completed. The cycle is then repeated starting with the step of loading the wafer into the plasma etch chamber followed by plasma clean and chamber seasoning of the plasma etch chamber.

16 Claims, 3 Drawing Sheets

SINGLE WAFER IN-SITU DRY CLEAN AND SEASONING FOR PLASMA ETCHING PROCESS

BACKGROUND OF THE INVENTION (1) Field of the Invention

The invention relates to the fabrication of integrated circuit devices and more particularly, to a method of cleaning a vacuum treatment apparatus to remove previously deposited polymer.

(2) Description of the Prior Art

The semiconductor manufacturing industry continues to put heavy emphasis on increasing device performance while limiting the manufacturing cost, these objectives have been successfully addressed by the trend to micro-miniaturization and by the ability to produce chips with sub-micron features.

The attainment of micro-miniaturization has been aided by the advances in specific semiconductor fabrication disciplines, most notably photolithography and dry etching. The use of more sophisticated exposure cameras, as well as the use of more sensitive photo-resist materials, have allowed sub-micron features to be routinely achieved in photo-resist layers. In addition, the development of dry etching tools and procedures have allowed the successful transfer of the sub-micron images, in an overlying photo-resist layer, to an underlying material that is used in the fabrication of semiconductors. The tools and procedures used during Reactive Ion Etching (RIE) now allow single wafer etching to be performed. This allows each single wafer to be etched individually, with end point detection used for only this single wafer. Thus wafer to wafer uniformity variations, of the layer being patterned using single layer RIE etching, is not as great a problem as encountered with batch RIE etching. Thus large volumes of wafers can be confidently processed using single wafer RIE procedures, with a decreased risk of under or over-etching due to thickness variations of the material being etched.

Dry etching, such as plasma etching and reactive ion etching, has become the technology of choice in patterning various layers that are formed over a silicon wafer as it is processed to form high density integrated circuit devices. This is because it is a process that not only can be highly selective in the materials that it etches, but because it can also perform highly anisotropic etching. This makes etching possible with nearly vertical sidewalls.

Basically, in plasma etching as used in the manufacturing of silicon integrated devices, a silicon wafer on whose surface have been deposited various layers, is positioned on a first electrode in a chamber that also includes a second electrode spaced opposite the first. As a gaseous medium that consists of one or more gasses is flowed through the chamber, an r-f voltage, which may include components of different frequencies, is applied between the two electrodes to create a discharge that ionizes the gaseous medium and that forms a plasma that etches the wafer. By appropriate choice of the gasses of the gaseous medium and the parameters of the discharge, selective and anisotropic etching is achieved.

While elaborate theories have been developed to explain the plasma process, in practice most of such processes have been developed largely by experimentation involving trial and error of the relatively poor predictability of results otherwise.

Moreover, because of the number of variables involved and because most etching processes depend critically not only on the particular materials to be etched but also on the desired selectivity and anisotropy, such experimentation can be time consuming while success often depends on chance.

A typical semiconductor-processing environment uses special procedures to clean a vacuum treatment apparatus and to thereby remove previously deposited residues that have accumulated on interior surfaces of the apparatus. There are two methods in which chamber cleaning is usually implemented. In the first, the cleaning process is carried out for a set period of time. Generally, the time is sufficiently long to include an over cleaning, by which removal of all film from the chamber walls is assured. The problem with this approach is that over cleaning reduces the productivity of the tool and can eventually cause damage to the chamber walls.

A frequently used procedure using plasma processing chambers is to dry etch a stack of thin layers which can include a photo-resist (for patterning the underlying layer), an anti-reflective coating (also known as an ARC layer, used for covering the surface of the underlying layer and typically formed over an underlying aluminum layer prior to coating this layer with photoresist), a barrier layer formed of titanium nitride, tantalum, tungsten, niobium, molybdenum, Ti/TiN or Ti/W but more preferably formed of TiN. Typical cleaning procedures are used that remove polymer with pure oxygen and further etches the dielectric with $CHF_3+Ar+CF_4$. Such etching, however, results in residues or deposits building up on surfaces inside the plasma treatment chamber. Similar buildup of deposits occurs in plasma treatment chambers wherein deposition is carried out.

During the process of dry etching in a chlorine-based plasma or a sequence of chlorine-based and fluorine-based dry etches, residual reaction products are deposited on exposed surfaces in the plasma treatment chamber. These residues contain metals (or silicates, depending on which type of dry etch is used), chlorine, and organics (or compounds of the aforementioned materials). The surfaces that the residues adhere to include upper and lower electrode surfaces, walls of the plasma treatment chamber, clamping surfaces, and any other item that the plasma or its byproducts come in contact with. A build-up of these residues deteriorates the etch performance of the dry etch and is therefore undesirable.

Polymer ($SiCl_xO_y$) compositions can typically contain silicons, carbons, fluoride, chlorides and oxygens. However, often the term polymer is used to describe an amalgam of chemicals that have been deposited or accumulated on exposed surfaces of a plasma-processing chamber.

The materials that are deposited on the exposed surfaces of a plasma-processing chamber have a loose structure and tend to peel off and generate particles and flakes when the thickness of the deposition reaches a certain thickness. The process of cleaning and seasoning of the plasma-processing chamber therefore is of paramount importance as a factor in determining the productive use of the chamber. The examples that have been indicated above illustrate that different etching chemistries are applied using the same etching chamber at different times for different processes. It is therefore a requirement that the conditions of impurity depositions within the chamber are strictly controlled, a control that must be instituted in such a manner that wafer throughput and wafer quality are not negatively affected by the processes of chamber clean. The concept of chamber clean is basic and is aimed at removing impurities from within the chamber. The concept of chamber seasoning indicates that conditions are applied to the chamber that enhance or further prepare the process of chamber clean or that prepares the chamber for further wafer processing after the chamber clean process has been completed. Conventional processing conditions for these two steps are as follows:

Dry Clean Process:
cleaning gasses: $SF_6/Cl_2/O_2$
wafer type: $SiO_2$ wafer
wafer quantity: 1 to 2 wafers
process time: about 20 minutes.
Seasoning process:
seasoning gasses: $Cl_2/HBr/HeO_2$
wafer type: silicon wafer
wafer quantity: 3 to 5 wafers
process time: about 30 minutes.

The above sequence of chamber clean/chamber seasoning has essentially already been highlighted and can be characterized as follows:

reduced chamber throughput due to the extended period of time that is required for the two steps of chamber clean and chamber seasoning the current process is excessively complex and requires more than one wafer, and the removal of contaminants from the exposed surfaces of the chamber is not complete or optimized due to limitations that are imposed by the seasoning process.

The invention addresses the above-indicated limitations by incorporating the dry and the seasoning processes into one processing sequence thereby reducing the impact of chamber cleaning/seasoning that is presently experienced as a result of multiple wafer processing sequences using the same chamber. As a result of the method of the invention, the chamber conditions are maintained at the desired level independent of the number of processing sequences that have been executed by the chamber.

SUMMARY OF THE INVENTION

A principle objective of the invention is to provide a method of conditioning a Plasma Etching Chamber such that the chamber can be used in a continuous processing stream for plasma etching processes.

Another objective of the invention is to increase the throughput of the Plasma Etch chamber.

Yet another objective of the invention is to reduce the complexity of the process of cleaning and conditioning a Plasma Etch Chamber that is used for multiple and diverse processes of plasma etching.

A still further objective of the invention is to optimize control of deposits that accumulate on exposed surfaces inside a Plasma Etch chamber.

In accordance with the objectives of the invention a new method is provided for the cleaning and seasoning of a Plasma Etch chamber. The wafer that is to be processed by the chamber is inserted into the chamber. The process of plasma clean is first performed on the Plasma Etch Chamber followed by a seasoning process of the Plasma Etch Chamber. The wafer is processed (etched) and removed from the chamber after the etch process has been completed. The cycle is then repeated starting with the step of loading the wafer into the plasma etch chamber followed by plasma clean and chamber seasoning of the plasma etch chamber.

DESCRIPTION OF THE PREFERRED EMBODIMENTS

Figure 1:
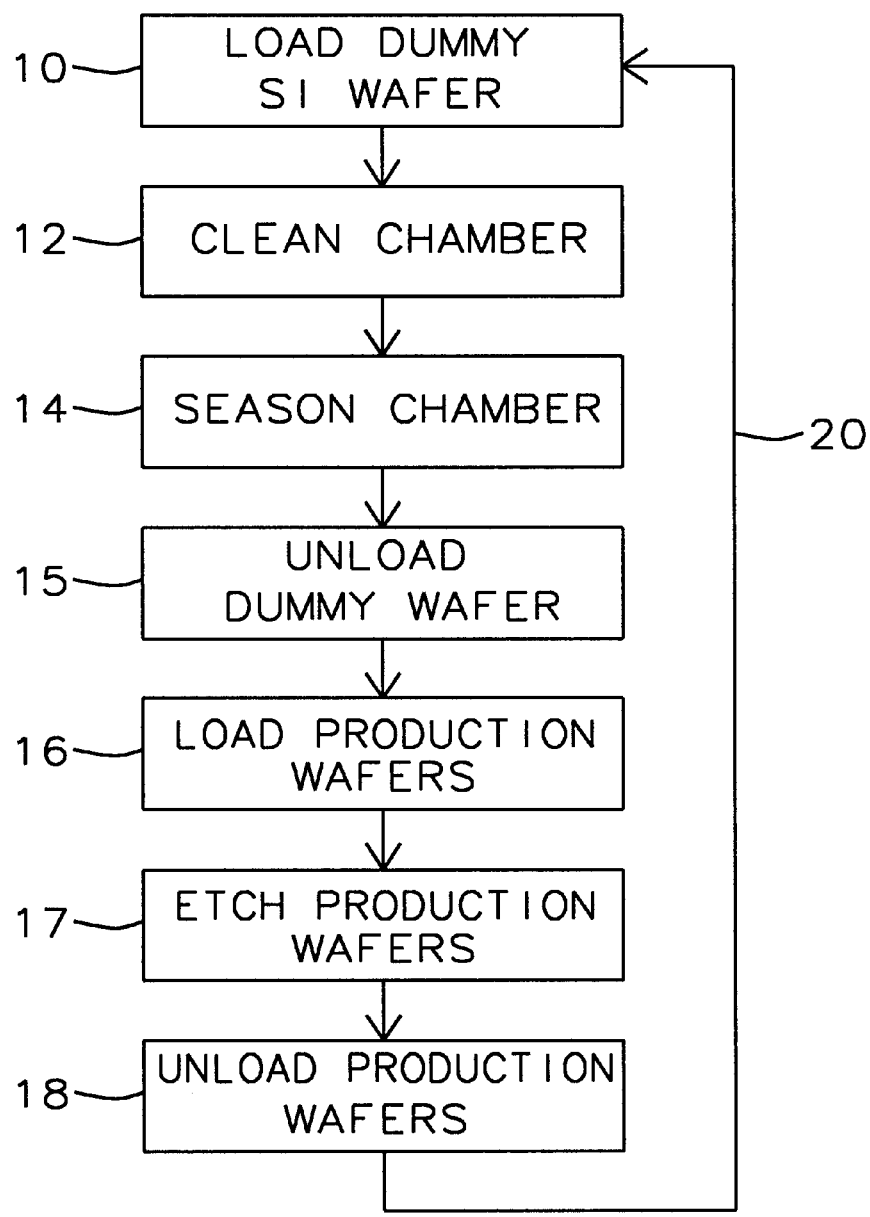
FIG. 1 gives a block diagram of the operational steps of the invention.

Referring now specifically to FIG. 1, there is shown the steps of the invention that are required to process a wafer in accordance with the invention.

FIG. 1, step 10 indicates that the dummy silicon wafer is loaded into the Plasma Etch Chamber. This processing step does not require any further detail.

FIG. 1, step 12 indicates that the process of chamber clean is performed on the Plasma Etch Chamber. This process of chamber clean is further detailed under FIG. 2 below and will therefore not be addressed in detail at this point.

FIG. 1, step 14 indicates that the process of chamber seasoning is performed on the Plasma Etch Chamber. This process of chamber clean is further detailed under FIG. 3 below and will therefore not be addressed in detail at this point.

FIG. 1, step 15 indicates that the dummy wafer is unloaded from the plasma etch chamber. This processing step does not require any further detail.

FIG. 1, step 16 indicates that the production wafers are loaded into the plasma etch chamber. This processing step does not require any further detail.

FIG. 1, step 17 indicates that the production wafer is being etched in the Plasma Etch Chamber. The processing conditions are not germane to the invention and can be any of the typical etching processes that are performed as part of semiconductor device processing. This step therefore also will not be further described at this time.

As an example of such a process of wafer etch can be mentioned for instance a plasma etch employed at a reaction chamber pressure of about 100 Torr, a r.f. power of about 1000 Watt at a radio frequency of about 13.56 MHz, a substrate temperature of about zero degrees, a carbon tetrafluorice flow rate of about 80 standard cubic centimeters per minute (sccm) and an argon flow rate of about 600 sccm for a time period of about 40 seconds which included about 20 percent overetch.

FIG. 1, step 18 indicates that the production wafers are unloaded from the Plasma Etch Chamber. This processing step does not require any further detail.

FIG. 1, step 20 indicates that the return loop that indicates that the sequence that has been described above under FIG. 1, steps 10 through and including step 18, is repeated after the last step of the sequence, that is FIG. 1, step 18, has been completed. It is the claim of the invention that this repetition can be followed for numerous steps of wafer etch (FIG. 1, step 17) and is, under the processing steps of the invention, no longer affected by temporary conditions of impurity deposits on the exposed parts inside the Plasma Etch chamber.

The step of cleaning the etch chamber that has been developed under the invention cleans all of the built-up polymer deposition from the exposed surfaces of the plasma etch chamber and ensures that the chamber remains in a clean condition at all times. The gasses used for this clean up process are $SF_6/Cl_2$. The step of seasoning is developed to condition the chamber surface to a desired state. The gasses used for the step of seasoning are $HBr/He-O_2$ for applications where poly etching is performed on the wafer that is processed. Since every wafer lot is processed under the same chamber conditions, the process is stable and independent of the etch processing components and conditions. This approach has reduced the number of wafers required for each cleaning cycle of the etch chamber from a previous number (typically six wafers) to just one wafer thereby effectively eliminating any limitation on a continuous and uninterrupted processing sequence by the etch chamber. This approach clearly also greatly enhances the throughput of the plasma etch chamber. The parameters of chamber clean and chamber seasoning that are indicated below are designed for poly etching applications. It is clear that similar parameters can be developed for other etch processes so that, once these parameters are known, the invention can be extended to any process of wafer etch that is executed in the plasma etch chamber.

Figure 2:
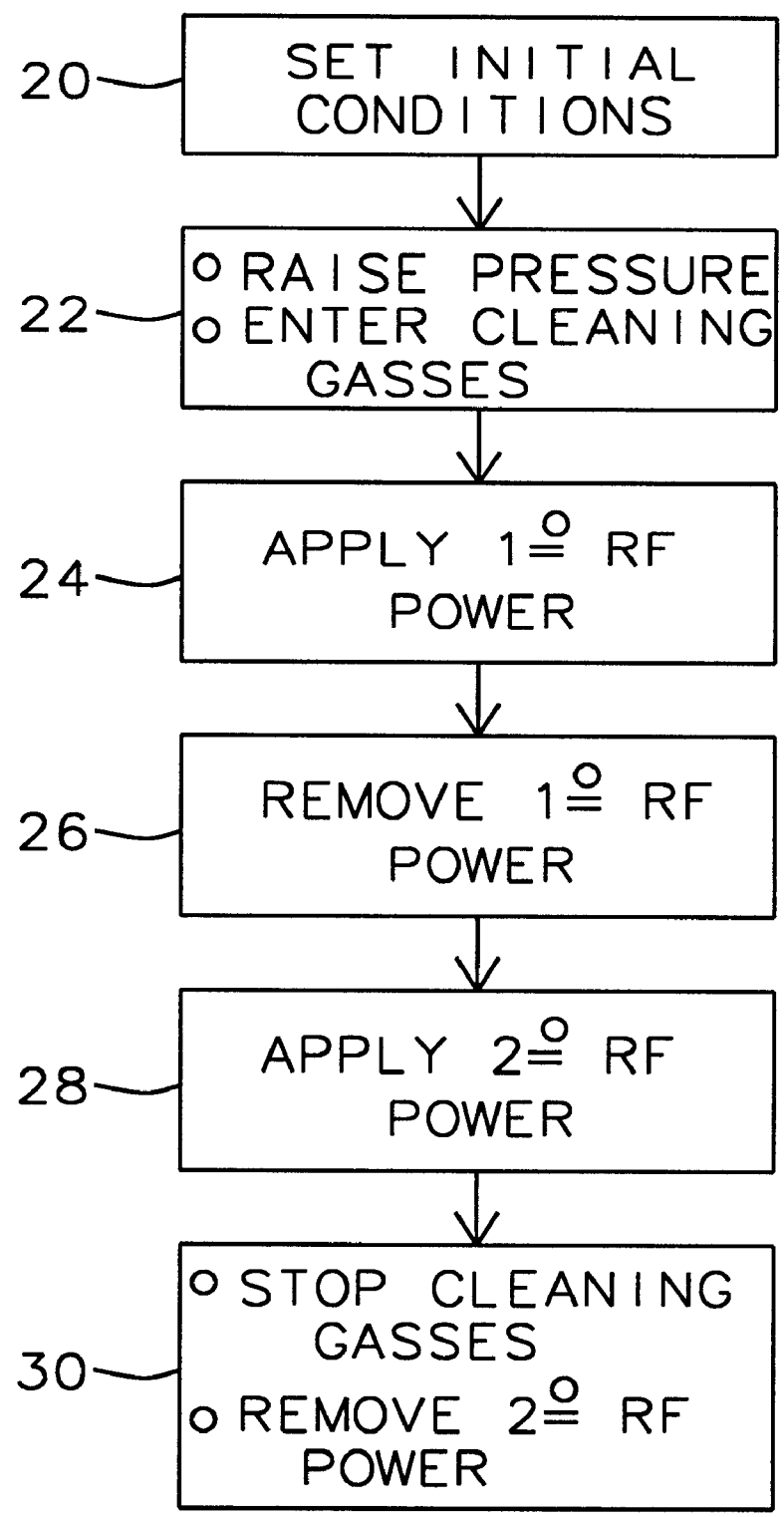
FIG. 2 shows the processing steps of chamber clean of the invention.

Referring now to FIG. 2, there is shown the sequence of processing steps that form the cleaning process of the Plasma Etch Chamber. A total of six steps is required for this sequence, these steps are detailed below. The sequence of the etch chamber clean processing steps that are detailed below all use the same format.

FIG. 2, step 20 shows the step of establishing the initial conditions for the clean cycle, these conditions are as follows:

| Pressure: | 0 mTorr; | RF TCP: | 0 watt; | RF BP: | 0 watt; |
|---|---|---|---|---|---|
| Gap: | 8.1 mm; | Cl$_2$ flow: | 0 sccm; | O$_2$ flow: | 0 sccm; |
| He/O$_2$ flow: | 0 sccm; | CF$_4$ flow: | 0 sccm; | HBr flow: | 0 sccm; |
| SF$_6$ flow: | 0 sccm; | He flow: | 0 sccm; | CHF$_3$ flow: | 0 sccm; |
| He clamp: | 8 mm; | | | | |
| completion criterion: time; time for completion: 10 seconds. | | | | | |

FIG. 2, step 22 shows the second step of the clean cycle, the conditions that have been changed from the preceding conditions have been underlined. For the second step of the clean cycle, the chamber pressure is raised while the cleaning gasses are entered into the chamber. The time during which this step is applied is also extended from the initial step one, the processing conditions of the second step are applied until the conditions within the etch chamber are stabilized. The operating conditions are as follows:

| Pressure: | 15 mTorr; | RF TCP: | 0 watt; | RF BP: | 0 watt; |
|---|---|---|---|---|---|
| Gap: | 8.1 mm; | Cl$_2$ flow: | 50 sccm; | O$_2$ flow: | 0 sccm; |
| He/O$_2$ flow: | 0 sccm; | CF$_4$ flow: | 0 sccm; | HBr flow: | 0 sccm; |
| SF$_6$ flow: | 75 sccm; | He flow: | 0 sccm; | CHF$_3$ flow: | 0 sccm; |
| He clamp: | 8 mm; | | | | |
| completion criterion: stable; time for completion: 30 seconds. | | | | | |

FIG. 2, step 24 shows third step of the clean cycle. For the third step of the clean cycle, the chamber rf TCP power is raised. The time during which this step is applied is extended from step 2, the processing conditions of the second step are applied over a given period of time. The operating conditions are as follows:

| Pressure: | 15 mTorr; | RF TCP: | 700 watt; | RF BP: | 0 watt; |
|---|---|---|---|---|---|
| Gap: | 8.1 mm; | Cl$_2$ flow: | 50 sccm; | O$_2$ flow: | 0 sccm; |
| He/O$_2$ flow: | 0 sccm; | CF$_4$ flow: | 0 sccm; | HBr flow: | 0 sccm; |
| SF$_6$ flow: | 75 sccm; | He flow: | 0 sccm; | CHF$_3$ flow: | 0 sccm; |
| He clamp: | 8 mm; | | | | |
| completion criterion: time; time for completion: 180 seconds. | | | | | |

FIG. 2, step 26 shows the fourth step of the clean cycle. For the fourth step of the clean cycle, the chamber rf TCP power is removed. The time during which this step is applied is reduced from step 3, the processing conditions of the second step are applied until the conditions within the etch chamber are stabilized. The operating conditions are as follows:

| Pressure: | 15 mTorr; | RF TCP: | 0 watt; | RF BP: | 0 watt; |
|---|---|---|---|---|---|
| Gap: | 8.1 mm; | Cl$_2$ flow: | 50 sccm; | O$_2$ flow: | 0 sccm; |
| He/O$_2$ flow: | 0 sccm; | CF$_4$ flow: | 0 sccm; | HBr flow: | 0 sccm; |
| SF$_6$ flow: | 75 sccm; | He flow: | 0 sccm; | CHF$_3$ flow: | 0 sccm; |
| He clamp: | 8 mm; | | | | |
| completion criterion: stable; time for completion: 30 seconds. | | | | | |

FIG. 2, step 28 shows the fifth step of the clean cycle. For the fifth step of the clean cycle, the chamber rf TCP power is again applied. The time during which this step is applied is increased from step 26, the processing conditions of the second step are applied over a given period of time. The operating conditions are as follows:

| Pressure: | 15 mTorr; | RF TCP: | 700 watt; | RF BP: | 0 watt; |
|---|---|---|---|---|---|
| Gap: | 8.1 mm; | Cl$_2$ flow: | 50 sccm; | O$_2$ flow: | 0 sccm; |
| He/O$_2$ flow: | 0 sccm; | CF$_4$ flow: | 0 sccm; | HBr flow: | 0 sccm; |
| SF$_6$ flow: | 75 sccm; | He flow: | 0 sccm; | CHF$_3$ flow: | 0 sccm; |
| He clamp: | 8 mm; | | | | |
| completion criterion: time; time for completion: 120 seconds. | | | | | |

FIG. 2, step 30 shows the final step of the cleaning cycle. During this step the rf TCP power is removed, the cleaning gasses are no longer entered into the etch chamber and the He is entered into the etch chamber as a preparatory step in using the He/O$_2$ gasses for the seasoning procedure. The conditions for the final step of the cleaning cycle have been underlined where they differ from the preceding step of the clean cycle. These conditions are as follows:

| Pressure: | 20 mTorr; | RF TCP: | 0 watt; | RF BP: | 0 watt; |
|---|---|---|---|---|---|
| Gap: | 8.1 mm; | Cl$_2$ flow: | 0 sccm; | O$_2$ flow: | 0 sccm; |
| He/O$_2$ flow: | 0 sccm; | CF$_4$ flow: | 0 sccm; | HBr flow: | 0 sccm; |
| SF$_6$ flow: | 0 sccm; | He flow: | 200 sccm; | CHF$_3$ flow: | 0 sccm; |
| He clamp: | 8 mm; | | | | |
| completion criterion: time; time for completion: 30 seconds. | | | | | |

It must be noted that the processing conditions that are applied during the steps 22 and 26 of the cleaning process are identical, also identical are the processing conditions that are applied during steps 24 and 28 of the cleaning process.

The seasoning cycle consists of seven different processing steps, these processing steps will be presented in the same format as has been used for the clean cycle.

Figure 3:
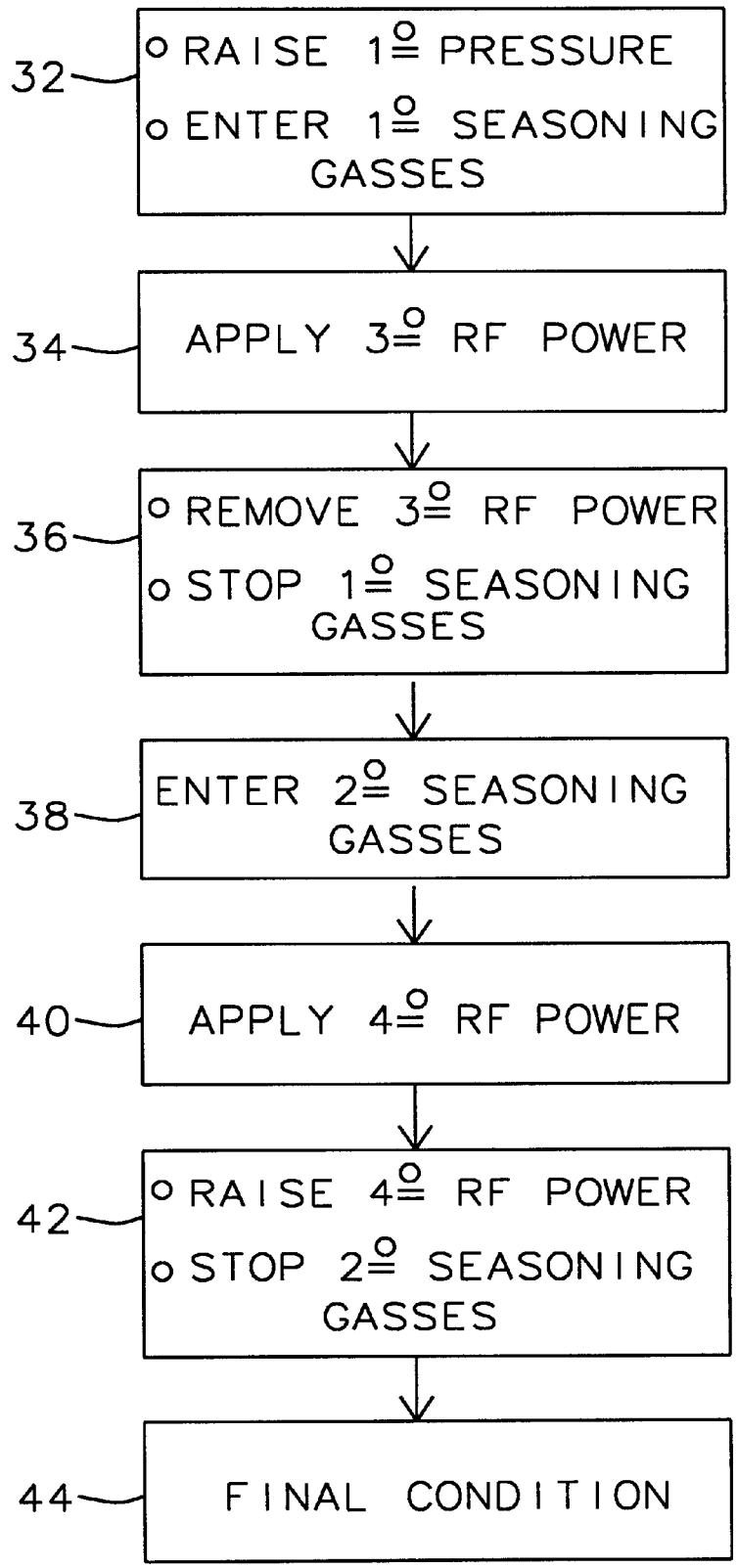
FIG. 3 shows the processing steps of chamber seasoning of the invention.

FIG. 3, step 32 shows the first step of the seasoning cycle. During this step the seasoning gasses are entered into the etch chamber. The processing conditions for the first step of the seasoning cycle have been underlined where they differ from the preceding (last) step of the clean cycle. These conditions are as follows:

| Pressure: | 80 mTorr; | RF TCP: | 0 watt; | RF BP: | 0 watt; |
|---|---|---|---|---|---|
| Gap: | 8.1 mm; | Cl$_2$ flow: | 0 sccm; | O$_2$ flow: | 0 sccm; |
| He/O$_2$ flow: | 10 sccm; | CF$_4$ flow: | 0 sccm; | HBr flow: | 300 sccm; |
| SF$_6$ flow: | 0 sccm; | He flow: | 0 sccm; | CHF$_3$ flow: | 0 sccm; |

He clamp: 8 mm;
completion criterion: stable; time for completion: 30 seconds.

FIG. 3, step 34 shows the second step of the seasoning cycle. During this step rf TCP and rf BP power is applied to the electrodes of the etch chamber. The processing conditions are as follows:

| Pressure: | 80 mTorr; | RF TCP: | 250 watt; | RF BP: | 200 watt; |
|---|---|---|---|---|---|
| Gap: | 8.1 mm; | Cl$_2$ flow: | 0 sccm; | O$_2$ flow: | 0 sccm; |
| He/O$_2$ flow: | 10 sccm; | CF$_4$ flow: | 0 sccm; | HBr flow: | 300 sccm; |
| SF$_6$ flow: | 0 sccm; | He flow: | 0 sccm; | CHF$_3$ flow: | 0 sccm; |
| He clamp: | 8 mm; | | | | | completion criterion: time; time for completion: 180 seconds.

FIG. 3, step 36 shows the third step of the seasoning cycle. During this step rf TCP and rf BP power is removed from the electrodes of the etch chamber, the flow of the seasoning gasses is cut-off while He is introduced into the etch chamber in preparation for the remaining steps of the seasoning process. The processing conditions are as follows:

| Pressure: | 80 mTorr; | RF TCP: | 0 watt; | RF BP: | 0 watt; |
|---|---|---|---|---|---|
| Gap: | 8.1 mm; | Cl$_2$ flow: | 0 sccm; | O$_2$ flow: | 0 sccm; |
| He/O$_2$ flow: | 0 sccm; | CF$_4$ flow: | 0 sccm; | HBr flow: | 0 sccm; |
| SF$_6$ flow: | 0 sccm; | He flow: | 200 sccm; | CHF$_3$ flow: | 0 sccm; |
| He clamp: | 8 mm; | | | | | completion criterion: time; time for completion: 30 seconds.

FIG. 3, step 38 shows the fourth step of the seasoning cycle. During this step the flow of the seasoning gasses is reestablished. The processing conditions are as follows:

| Pressure: | 80 mTorr; | RF TCP: | 0 watt; | RF BP: | 0 watt; |
|---|---|---|---|---|---|
| Gap: | 8.1 mm; | Cl$_2$ flow: | 0 sccm; | O$_2$ flow: | 0 sccm; |
| He/O$_2$ flow: | 10 sccm; | CF$_4$ flow: | 0 sccm; | HBr flow: | 300 sccm; |
| SF$_6$ flow: | 0 sccm; | He flow: | 0 sccm; | CHF$_3$ flow: | 0 sccm; |
| He clamp: | 8 mm; | | | | | completion criterion: stable; time for completion: 30 seconds.

FIG. 3, step 40 shows the fifth step of the seasoning cycle. During this step the rf TCP and rf BP power is again applied to the electrodes of the chamber, the flow of the seasoning gasses remains as is. The processing conditions are as follows:

| Pressure: | 80 mTorr; | RF TCP: | 250 watt; | RF BP: | 200 watt; |
|---|---|---|---|---|---|
| Gap: | 8.1 mm; | Cl$_2$ flow: | 0 sccm; | O$_2$ flow: | 0 sccm; |
| He/O$_2$ flow: | 10 sccm; | CF$_4$ flow: | 0 sccm; | HBr flow: | 300 sccm; |
| SF$_6$ flow: | 0 sccm; | He flow: | 0 sccm; | CHF$_3$ flow: | 0 sccm; |
| He clamp: | 8 mm; | | | | | completion criterion: time; time for completion: 180 seconds.

FIG. 3, step 42 shows the sixth step of the seasoning cycle. During this step the rf TCP and rf BP power is removed from the electrodes of the chamber, the flow of the seasoning gasses is cut-off while He is again introduced into the etch chamber in preparation for the final processing step of the seasoning cycle. The processing conditions are as follows:

| Pressure: | 80 mTorr; | RF TCP: | 0 watt; | RF BP: | 0 watt; |
|---|---|---|---|---|---|
| Gap: | 8.1 mm; | Cl$_2$ flow: | 0 sccm; | O$_2$ flow: | 0 sccm; |
| He/O$_2$ flow: | 0 sccm; | CF$_4$ flow: | 0 sccm; | HBr flow: | 0 sccm; |
| SF$_6$ flow: | 0 sccm; | He flow: | 200 sccm; | CHF$_3$ flow: | 0 sccm; |
| He clamp: | 8 mm; | | | | | completion criterion: time; time for completion: 30 seconds.

FIG. 3, step 44 shows the seventh and final step of the seasoning cycle. During this step the pressure is reduced, the flow of the He is cut-off in preparation for the first processing step of the clean cycle. The processing conditions are as follows:

| Pressure: | 0 mTorr; | RF TCP: | 0 watt; | RF BP: | 0 watt; |
|---|---|---|---|---|---|
| Gap: | 8.1 mm; | Cl$_2$ flow: | 0 sccm; | O$_2$ flow: | 0 sccm; |
| He/O$_2$ flow: | 0 sccm; | CF$_4$ flow: | 0 sccm; | HBr flow: | 0 sccm; |
| SF$_6$ flow: | 0 sccm; | He flow: | 0 sccm; | CHF$_3$ flow: | 0 sccm; |
| He clamp: | 8 mm; | | | | | completion criterion: time; time for completion: not applicable.

It must be noted that the processing conditions that have been established under the seventh and final step of the seasoning cycle are identical as the processing conditions that are used for the first step (step 20, FIG. 2) of the clean cycle. The clean and the seasoning cycle can therefore transit from one into the other without having the further readjust any processing parameters. The time for completion of the seventh step of the seasoning cycle has been indicated as being not applicable since the seventh cycle of the seasoning process has as purpose to prepare the etch chamber for the (to follow) clean cycle. The main purpose of this seventh step is to set the operating conditions of the etch chamber to be equal to the operating conditions that are required at the start of the clean cycle. This time of the seventh step has therefore no direct impact on accomplishing the objectives of the invention.

It must be further be noted that the processing conditions that are applied during the steps 32 and 38 of the seasoning process are identical, also identical are the processing conditions that are applied during steps 34 and 40 and during steps 36 and 42 of the seasoning process. The processing sequence 32, 34 and 36 is therefore identical to the processing sequence 38, 40 and 42.

The following points that relate to the invention must be emphasized:

1) The invention teaches a method of cleaning a vacuum processing apparatus whereby previously accumulated polymer residues are removed while a wafer is present in the processing chamber. This presence of the wafer inside the processing chamber while the processes of chamber clean and chamber seasoning are performed is a new approach that differs from present accepted methods of chamber clean. The etch chamber uses an Electronic Static Chuck (ESC) on which the wafer is held during wafer processing. The presence of the wafer inside the chamber during the process of chamber clean/seasoning has the following objectives:
   to protect the anodized ESC chuck during the cleaning process
   to season the exposed surfaces in the process chamber by coating a fresh layer of SiBr and SiOBr over these surfaces thereby adhering any loose particles to these surfaces and furthermore removing any remaining fluorine to be able to etch any subsequent semiconductor wafers using the same (initial) processing chamber, eliminating the impact of the "first wafer" effect.

2) The invention teaches the use of $SF_6/Cl_2$ cleaning chemistry whereas present processes use $SF_6/Cl_2/O_2$ chemistry. The presence of the $O_2$ residual increases the poly etch rate and causes CD bias shift. CD is the critical dimension difference before and after the etching. The measurements are taken at designated features. This parameter helps to identify the stability of the process, the formula is as follows: CD Bias=FiCD−DiCD where FiCD is the final inspection critical dimension and DiCD is the developed inspect critical dimension. CD bias shift is a deviation in the CD bias when compared to the normal value that is obtained from an existing, stable process. A CD bias shift would indicate that the process has changed which results in a change in transistor performance.

3) The particular process of the invention that has been detailed above and that has been indicated as being applicable to poly etching can be explained as follows:

the majority of the polymer that is generated during polymer etching contains $SiBr_4$ and $SiOBr$ which is deposited on the exposed surfaces of the chamber but not on the ESC chuck since the surface of the chuck is covered by the wafer that is present inside the etch chamber the seasoning step that is part of the invention is meant to condition the chamber by using HBr, $He/O_2$ and the silicon wafer after the plasma etch process has been completed. The helium gas is a diluting gas. The two polymers that are generated are generated on purpose in order to fully restore the chamber condition to the condition that exists during the production run. The "first wafer" effect is in this manner completely eliminated, that is the etch conditions that are experienced by the first wafer are no longer different from the etch conditions that are in force during subsequent wafer etching in the same etch chamber.

The chemical reaction for the process that is created in this way can be presented as follows:

$Si+4HBr \rightarrow SiBr_4+2H_2$ (gas)

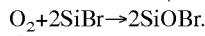

$O_2+2SiBr \rightarrow 2SiOBr$.

4) Current processes use gas only to clean and to condition the etch chamber without the use of a wafer. The present processes can therefore only be applied to process chambers that use clamping surfaces to hold the wafer to the lower electrode, these clamping surfaces are presently no longer in use. The ESC chuck is at this time used in all advanced etching chambers as the lower electrode. By exposing the ESC chuck to plasma the useful lifetime of the chuck will be sharply reduced. By exposing the ESC chuck during the plasma cleaning and coating process particles will be created on the surface of the chuck. These particles result in:

poor heat transfer across the wafer due to the flow of helium underneath the wafer that is not uniformly distributed. This effect will demonstrate itself as photoresist burning the wafer will not be properly seated on the surface of the ESC chuck.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for single wafer in-situ cleaning and seasoning of polymer depositions in a plasma etch chamber by a continuous in-stream processing sequence, comprising the steps of:

providing a plasma etch chamber;

providing a dummy semiconductor wafer;

entering said dummy wafer into said plasma etch chamber;

cleaning said plasma etch chamber by setting initial conditions for said cleaning inside said plasma etch chamber, by then raising pressure inside said plasma etch chamber while simultaneously entering cleaning gasses into said plasma etch chamber, by then applying first time rf power to said plasma etch chamber, by then removing said first time rf power applied to said plasma etch chamber, by then applying second time rf power to said plasma etch chamber and by then removing said second time rf power applied to said plasma etch chamber while simultaneously stopping the flow of cleaning gasses into said plasma etch chamber while simultaneously introducing He into said plasma etch chamber;

seasoning said plasma etch chamber;

unloading said dummy wafer from said plasma etch chamber upon completion of said etch process.

2. The method of claim 1 wherein said setting initial conditions for said cleaning inside said plasma etch chamber is applying the following processing conditions to said plasma etch chamber: chamber pressure equals about 0 mTorr, no rf power applied to electrodes of said plasma etch chamber, an electrode gap setting at about 8.1 mm, a He clamp setting at about 8 mm, a time for completion of this step being about 10 seconds.

3. The method of claim 1 wherein said raising pressure inside said plasma etch chamber while simultaneously entering cleaning gasses into said plasma etch chamber is raising pressure inside said plasma etch chamber to about 15 mTorr, applying no rf power to electrodes of said plasma etch chamber, maintaining a gap setting at about 8.1 mm, entering $Cl_2$ into said plasma etch chamber with a flow rate of about 50 sccm in addition to entering $SF_6$ into said plasma etch chamber with a flow rate of about 75 sccm, maintaining a He clamp setting at about 8 mm, allowing conditions inside said plasma etch table to stabilize with a time for completion of about 30 seconds.

4. The method of claim 1 wherein said applying first time rf power to said plasma etch chamber is setting pressure inside said plasma etch chamber to about 15 mTorr, applying about 700 rf TCP power to electrodes of said plasma etch chamber, maintaining a gap setting at about 8.1 mm, entering $Cl_2$ into said plasma etch chamber with a flow rate of about 50 sccm in addition to entering $SF_6$ into said plasma etch chamber with a flow rate of about 75 sccm, maintaining a He clamp setting at about 8 mm, allowing for this processing step to be in effect for about 180 seconds.

5. The method of claim 1 wherein said removing said first time rf power applied to said plasma etch chamber is setting pressure inside said plasma etch chamber to about 15 mTorr, applying no rf power to electrodes of said plasma etch chamber, maintaining a gap setting at about 8.1 mm, entering $Cl_2$ into said plasma etch chamber with a flow rate of about 50 sccm in addition to entering $SF_6$ into said plasma etch chamber with a flow rate of about 75 sccm, maintaining a He clamp setting at about 8 mm, allowing conditions inside said plasma etch table to stabilize with a time for completion of about 30 seconds.

6. The method of claim 1 wherein said applying second time rf power to said plasma etch chamber is setting a pressure inside said plasma etch chamber to about 15 mTorr, applying about 700 rf TCP power to electrodes of said plasma etch chamber, maintaining a gap setting at about 8.1 mm, entering $Cl_2$ into said plasma etch chamber with a flow rate of about 50 sccm in addition to entering $SF_6$ into said plasma etch chamber with a flow rate of about 75 sccm, maintaining a He clamp setting at about 8 mm, allowing for this processing step to be in effect for about 120 seconds.

7. The method of claim 1 wherein said removing said second time rf power applied to said plasma etch chamber while simultaneously stopping flow of cleaning gasses into said plasma etch chamber while simultaneously introducing He into said plasma etch chamber is setting a pressure inside said plasma etch chamber to about 20 mTorr, applying no rf power to electrodes of said plasma etch chamber, maintaining a gap setting at about 8.1 mm, entering He into said plasma etch chamber with a flow rate of about 200 sccm, maintaining a He clamp setting at about 8 mm, allowing for this processing step to be in effect for about 30 seconds.

8. The method of claim 1 wherein said seasoning said plasma etch chamber comprises the steps of:

raising pressure inside said plasma etch chamber while simultaneously entering first time seasoning gasses into said plasma etch chamber;

applying third time rf power to said plasma etch chamber;

removing said third time rf power applied to said plasma etch chamber while simultaneously cutting off flow of said first time seasoning gasses into said plasma etch chamber;

entering second time seasoning gasses into said plasma etch chamber;

applying fourth time rf power to said plasma etch chamber;

removing said fourth time rf power applied to said plasma etch chamber while simultaneously cutting off flow of said second time seasoning gasses into said plasma etch chamber;

establishing final processing conditions of said seasoning cycle.

9. The method of claim 8 wherein said raising the pressure inside said plasma etch chamber while simultaneously entering first time seasoning gasses into said plasma etch chamber is setting pressure inside said plasma etch chamber to about 80 mTorr, applying no rf power to electrodes of said plasma etch chamber, maintaining a gap setting at about 8.1 mm, entering $He/O_2$ into said plasma etch chamber with a flow rate of about 10 sccm in addition to entering HBr into said plasma etch chamber with a flow rate of about 300 sccm, maintaining a He clamp setting at about 8 mm, allowing conditions inside said plasma etch table to stabilize with a time for completion of about 30 seconds.

10. The method of claim 8 wherein said applying third time rf power to said plasma etch chamber is maintaining pressure inside said plasma etch chamber at about 80 mTorr, applying about 250 watts TCP rf power and about 200 BP rf power to electrodes of said plasma etch chamber, maintaining a gap setting at about 8.1 mm, entering $He/O_2$ into said plasma etch chamber with a flow rate of about 10 sccm in addition to entering HBr into said plasma etch chamber with a flow rate of about 300 sccm, maintaining a He clamp setting at about 8 mm, allowing for this processing step to be in effect for about 180 seconds.

11. The method of claim 8 wherein said removing said third time rf power applied to said plasma etch chamber while simultaneously cutting off flow of said first time seasoning gasses into said plasma etch chamber is maintaining pressure inside said plasma etch chamber at about 80 mTorr, applying no rf power to electrodes of said plasma etch chamber, maintaining a gap setting at about 8.1 mm, entering no seasoning gasses into said plasma etch chamber, entering He into said plasma etch chamber with a flow rate of about 200 sccm, maintaining a He clamp setting at 8 about mm, allowing for this processing step to be in effect for about 30 seconds.

12. The method of claim 8 wherein said entering second time seasoning gasses into said plasma etch chamber is maintaining pressure inside said plasma etch chamber at about 80 mTorr, applying no rf power to electrodes of said plasma etch chamber, maintaining a gap setting at about 8.1 mm, entering $He/O_2$ into said plasma etch chamber with a flow rate of about 10 sccm in addition to entering HBr into said plasma etch chamber with a flow rate of about 300 sccm, maintaining a He clamp setting at about 8 mm, allowing conditions inside said plasma etch table to stabilize with a time for completion of about 30 seconds.

13. The method of claim 8 wherein said applying fourth time rf power to said plasma etch chamber is maintaining pressure inside said plasma etch chamber at about 80 mTorr, applying about 250 watts TCP rf power and about 200 BP rf power to electrodes of said plasma etch chamber, maintaining a gap setting at about 8.1 mm, entering $He/O_2$ into said plasma etch chamber with a flow rate of about 10 sccm in addition to entering HBr into said plasma etch chamber with a flow rate of about 300 sccm, maintaining a He clamp setting at about 8 mm, allowing for this processing step to be in effect for about 180 seconds.

14. The method of claim 8 wherein said removing said fourth time rf power applied to said plasma etch chamber while simultaneously cutting off flow of said second time seasoning gasses into said plasma etch chamber is maintaining pressure inside said plasma etch chamber at about 80 mTorr, applying no rf power to electrodes of said plasma etch chamber, maintaining a gap setting at about 8.1 mm, entering no seasoning gasses into said plasma etch chamber, entering He into said plasma etch chamber with a flow rate of about 200 sccm, maintaining a He clamp setting at about 8 mm, allowing for this processing step to be in effect for about 30 seconds.

15. The method of claim 8 wherein said establishing final processing conditions of said seasoning cycle is reducing pressure inside said plasma etch chamber at about 0 mTorr, applying no rf power to electrodes of said plasma etch chamber, maintaining a gap setting at about 8.1 mm, entering no seasoning gasses into said plasma etch chamber, entering no He into said plasma etch chamber, maintaining a He clamp setting at about 8 mm, whereby duration of this step is determined by an interval that is required to load a next wafer into said plasma etch chamber for etching of said wafer.

16. The method of claim 1 wherein said repeating a sequence of processing steps comprises at least one sequence of the steps of providing a dummy semiconductor wafer, entering said dummy wafer into said plasma etch chamber, cleaning said plasma etch chamber, seasoning said plasma etch chamber, unloading said dummy wafer from said plasma etch chamber followed by the etching of at least one production wafer using said plasma etch chamber.

* * * * *